(12) United States Patent
Shimokohbe et al.

(10) Patent No.: US 6,406,637 B1
(45) Date of Patent: Jun. 18, 2002

(54) THIN FILM-PLANAR STRUCTURE AND METHOD FOR PRODUCING THE SAME

(75) Inventors: Akira Shimokohbe; Seiichi Hata, both of Machida (JP)

(73) Assignee: Tokyo Institute of Technology, Tokyo (JP)

( * ) Notice: Subject to any disclaimer, the term of this patent is extended or adjusted under 35 U.S.C. 154(b) by 0 days.

(21) Appl. No.: 09/557,155

(22) Filed: Apr. 25, 2000

(30) Foreign Application Priority Data

May 7, 1999 (JP) ........................................... 11-126593

(51) Int. Cl.[7] ............................................. H01L 21/302
(52) U.S. Cl. ................. 216/2; 216/11; 216/23; 216/41; 216/52; 216/55; 216/83
(58) Field of Search ................................ 216/2, 11, 23, 216/41, 52, 55, 83, 99; 438/52

(56) References Cited

U.S. PATENT DOCUMENTS 4,161,557 A * 7/1979 Suzuki et al. .................. 428/1
5,576,074 A * 11/1996 Weigel et al. ............... 427/559
5,980,652 A * 11/1999 Inoue et al. ................. 148/403

FOREIGN PATENT DOCUMENTS

| JP | 9-126833 | 5/1997 |
|---|---|---|
| JP | 09-126833 A | * 5/1997 |

* cited by examiner

*Primary Examiner*—Anita Alanko
(74) *Attorney, Agent, or Firm*—Oliff & Berridge, PLC

(57) ABSTRACT

A thin film made of an amorphous material having a supercooled liquid phase region is formed on a substrate. Then, the thin film is processed by wet-etching, etc. to form a thin film-processed body having, for example, a one side-fixed beam like shape. Subsequently, the thin film-processed body is heated to a temperature within the supercooled liquid phase region and held at the temperature for 0.5–5 minutes. Thereafter, the thin film-processed body is cooled down to room temperature. Then, at least a part of the substrate is removed by wet-etching, etc. to form a thin film-planar structure composed of the thin film-processed body having the one side-fixed beam like shape.

4 Claims, 7 Drawing Sheets

RELATED ART

RELATED ART

THIN FILM-PLANAR STRUCTURE AND METHOD FOR PRODUCING THE SAME

BACKGROUND OF THE INVENTION

1. Field of the Invention

This invention relates a thin film planar structure and a method for producing the same, and more particularly the same structure and the same method suitable for parts constituting micro machines such as a micro actuator, cats, various sensors such as a micro sensor, various probes such as a sensor for a scanning probe-microscope, etc.

2. Description of the Prior Art

One side-fixed beams having good shape-accuracy, as their component, separated from substrates are desired for micro machines, various sensors, various probes, etc. Thus, planar structures such as beams composed of various thin films are being used by employing micro machining applied from thin film-forming techniques and micro processing techniques in manufacturing semiconductors.

The above thin film-planar structures are generally produced through the steps shown in FIGS. 1–4. FIG. 1 is a plan view showing a first step of a conventional method for producing a thin film-planar structure. FIG. 2 is a cross sectional view taken on line I—I of the plan view of FIG. 1. FIGS. 3 and 4 show steps after the step of FIGS. 1 and 2 with time.

First of all, as shown in FIGS. 1 and 2, after a resist is applied uniformly on a main surface 1A of a substrate 1, it is exposed and developed to form a patterned provisional layer 2. Then, as shown in FIG. 3, a thin film made of metal material or silicon material is formed, to cover the provisional layer 2, uniformly on the main surface 1A of the substrate 1. The thin film is etched to form a thin film-processed body 3 patterned into a given shape.

However, the thin film-planar-structure as shown in FIG. 4 is not often obtained, depending upon various conditions in producing the thin film-processed body 3, which results in a three-dimensional structure formed by the bending of the thin film-processed body 3 as shown in FIG. 5 or the destruction of the thin film-processed body 3 due to its too large bending as shown in FIG. 6.

The reasons for the above phenomena are that the internal stress-distribution of the thin film-processed body 3 is not uniform in the direction along its thickness. Accordingly, for making the internal stress uniform in the thickness direction, a gas pressure, a substrate temperature, an evaporation temperature or a sputtering output power etc. in forming, by a vapor deposition method, sputtering method or the like, the thin film uniformly before etching tried to be controlled appropriately. Moreover, for the object, the etching conditions tried to be also controlled variously.

The film-forming conditions in sputtering seriously influence the natures of the thin film-processed body 3. For example, if a gas pressure in sputtering is increased, its internal stress is decreased, but the density of the thin film-processed body 3 itself is degraded. As a result, the thus obtained thin film-planar structure is often degraded in mechanical strength and can not be often processed in a desired shape due to too etching in a successive etching process.

The internal stress of the thin film-processed body 3 is sensitive to such film-forming conditions. Thus, since precise controlling of the above film-forming conditions is required, it is difficult to obtain the thin film-planar structure in good reproducibility.

Moreover, the above various controlling of the etching conditions has difficulty figuring out the appropriate conditions to realize the relaxation of the internal stress and the etching the thin film at the same time,

SUMMARY OF THE INVENTION

It is an object of the present invention to provide a thin film-planar structure and a method for producing the same, capable of being produced in good reproducibility through controlling the internal stress.

This invention relates to a thin film-planar structure composed of a thin film made of an amorphous material having a supercooled liquid phase region.

This invention also relates to a method for producing a thin film planar structure comprising the steps of:

forming on a substrate a thin film made of an amorphous material having a supercooled liquid phase region, processing the thin film into a given shape to form a thin film-processed body, heating the thin film-processed body to a temperature within the supercooled liquid phase region, cooling down the thin film-processed body to a room temperature from the temperature within the supercooled liquid phase region and holding it at the temperature for a given time, removing at least a part of the substrate to produce the thin film-planar structure composed of the thin film-processed body.

This invention further relates to a method for producing a thin film-planar structure comprising the steps of:

forming on a substrate a patterned provisional layer, forming on the substrate a thin film made of an amorphous material having a supercooled liquid phase region so as to cover the provisional layer, processing the thin film into a given shape to form a thin film-processed body, heating the thin film-processed body to a temperature within the supercooled liquid phase region and holding it at the temperature for a given time, cooling down the thin film-processed body to a room temperature from the temperature within the supercooled liquid phase region, and removing the provisional layer to produce the thin film-planar structure composed of the thin film-processed body.

To iron out the above problems, this inventors has been intensely studied to develop a new material constituting the thin film-planar structure and a method for producing it. At last, they have found a way to solve the above problems as follows:

The thin film-planer structure is formed of a thin film made of an amorphous material having a supercooled liquid phase region, and the thin film is heated to a temperature within the supercooled liquid phase region.

That is, when the thin film made of the amorphous material having the supercooled liquid phase region is heated, it exhibits glass-transition phenomenon. Just then, the once solid and high rigid thin film becomes semisolid (supercooled liquid) and becomes in viscous flow of a viscosity of $10^8$–$10^3$ Pa·S. Thus, the internal stress generated in the thin film due to sputtering is relaxed.

Consequently, when the thin film is cooled down to room temperature and the provisional layer or a part of the substrate is removed, the thin film is not bended or destroyed.

This invention has been realized through this inventors' finding and attention of the above natures of the amorphous material having the supercooled liquid phase region and taking advantage of the natures.

Herein, the wording "a supercooled liquid phase region" is a temperature region from a glass-transition temperature (Tg) to a crystallizationstarting temperature (Tx).

Moreover, the wording "a thin film-planar structure" is a structure composed of a thin film-processed body formed by etch-processing in plane a thin film made of an amorphous material as above-mentioned, different from a structure composed of a thin film-processed body formed by three-dimensionally processing the thin film.

BRIEF DESCRIPTION OF THE DRAWINGS

The invention will be more particularly described with reference to the accompanying drawings.

DESCRIPTION OF THE PREFERRED EMBODIMENTS

Figure 1:
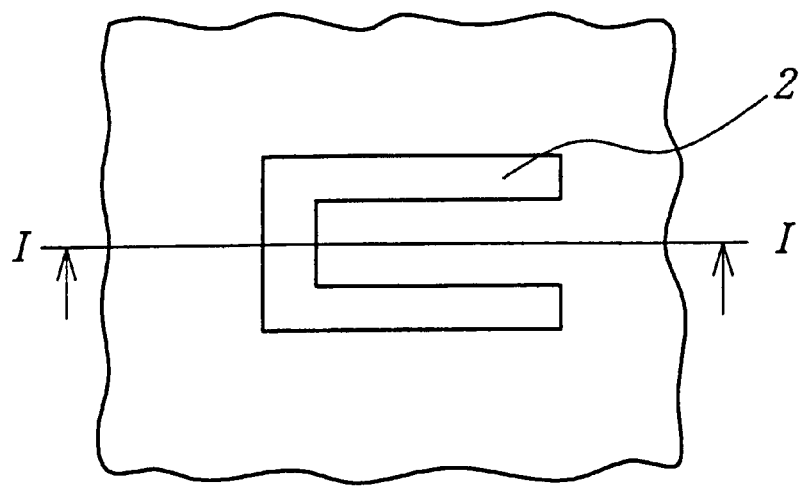
FIG. 1 is a plan view showing a first step in an embodiment of the conventional method for producing the thin film-planar structure.
Figure 2:
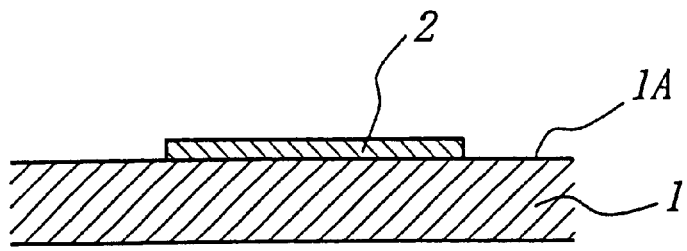
FIG. 2 is a cross sectional view taken on line I—I of the plan view in FIG. 1.
Figure 3:
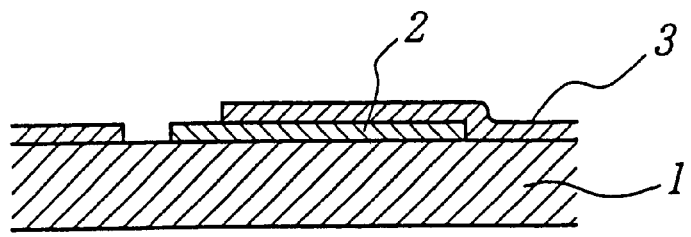
FIG. 3 is a cross sectional view showing a step after the step of FIGS. 1 and 2.
Figure 4:
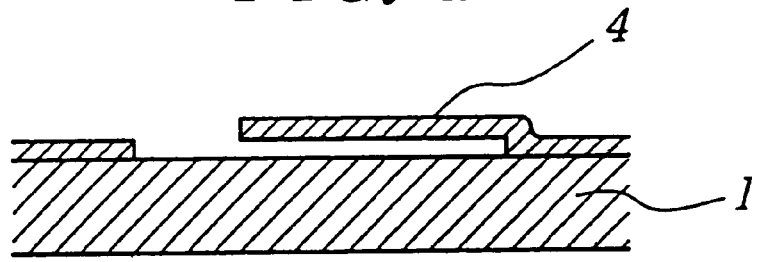
FIG. 4 is a cross sectional view showing a step after the step of FIG. 3.
Figure 5:
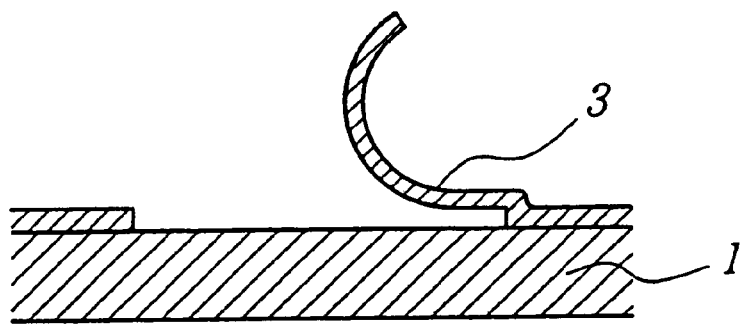
FIG. 5 is a cross sectional view showing a thin film-processed body produced by the conventional thin film-planer structure.
Figure 6:
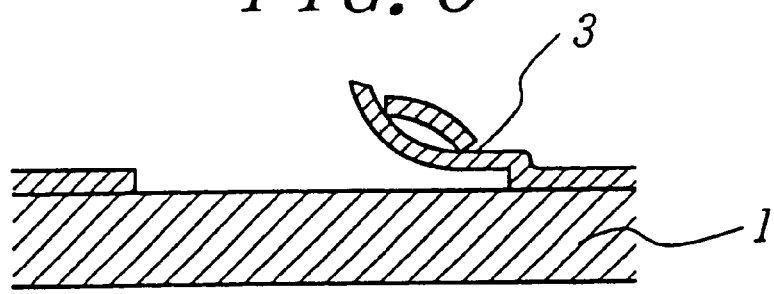
FIG. 6 is a cross sectional view showing another thin film-processed body produced by the conventional thin film-planar structure.

The invention will be described in detail as follows, with reference to the above drawings.

The thin film-planar structure requires to be formed of a thin film made of an amorphous material having a supercooled liquid phase region.

The amorphous material is not restricted if it can achieve the above object of the present invention. As the amorphous material is exemplified an oxidic glass ($SiO_2$, Pyrex glass, etc.) or a metallic glass made of a chalcogenide semiconductor (As—S, Si—As—Te, etc.), some amorphous alloy (Zr—Cu—Al, Pd—Cu—Si, etc.) or the like.

The amorphous material preferably has a glass-transition temperature of 200–600° C. in its supercooled liquid phase region, more preferably 250–400° C. The lower glass-transition temperature of the amorphous material enables the heating step of the thin film made of it to be simplified. Generally, the amorphous material has viscosity of $10^{11}$–$10^{13}$ Pa·S at nearby its glass-transition temperature. Therefore, the above internal stress in the thin film due to sputtering can be effectively removed.

Moreover, the supercooled liquid phase region preferably has a temperature width more than 20° C. The relatively large temperature width enables the heating step of the thin film to be simplified. Besides, it can reduce influence due to the temperature fluctuation in the heating.

Concretely, $Zr_{66}Cu_{39}Al$, $Pd_{76}Cu_6Si_{18}$, boron oxide etc. are exemplified as the amorphous material.

The thin film-planer structure of the present invention requires to be produced by heating the thin film made of like the above amorphous material to a temperature within its supercooled liquid phase region.

A sort of a material of which a substrate, constituting the thin film-planar structure, is made, is changed, depending upon the use of the thin film-planar structure. Generally, the substrate is made of single crystalline silicon, Pyrex glass, stainless steel, etc. In the case of making the substrate of the single crystalline silicon, an oxide film or a nitride film may be formed on the substrate.

Moreover, the thin film may be formed on the substrate by a well known method like a physical vapor deposition method such as a sputtering method, a vacuum vapor deposition or a chemical vapor deposition method such as a CVD method.

Subsequently, the thin film-planar structure requires to be produced by processing the thin film formed on the substrate as above-mentioned, to form a thin film-processed body.

The thin film may be processed by a well known micro processing techniques, represented by a wet-etching method using a solution of hydrofluoric acid or potassium hydroxide or a dry-etching method such as RIE (reactive ion etching).

The thin film-planar structure also requires to be produced by heating the thin film-processed body formed as above-mentioned to a temperature within the supercooled liquid phase region.

The heating of the thin film may be carried out by a well known means such as infrared heating, inductive heating, resistive heating.

The heat-holding time of the thin film-processed body in the supercooled liquid phase region depends on the sort of its material, the thickness of the thin film constituting it, the film-forming conditions, but generally, it is 0.5–5 minutes. Thereby, the internal stress in the thin film is sufficiently removed and the object of the present invention can be achieved.

Then, the thin film-planar structure of the present invention requires to be produced by cooling down the thin film-processed body to a room temperature from the temperature within the supercooled liquid phase region.

For cooling down the thin film-processed body, may be used such a cooling means as voluntary cooling such as heat radiation, introducing a cooling gas and contacting to a cooling board.

Moreover, the thin film-planar structure requires to be produced by removing at least a part of the substrate after cooling down the thin film-processed body to room temperature.

The part of the substrate may be removed by a well known micro processing techniques, represented by the wet-etching method or the dry-etching method, as above-mentioned.

In producing the thin film-planar structure of the present invention, a provisional layer patterned in a given shape may be formed before the thin film made of an amorphous material having a supercooled liquid phase region is formed. In this case, the thin film is formed on the substrate so as to cover the provisional layer. Instead of removing the part of the substrate, the provisional layer is removed to produce the thin film-planer structure.

The patterned provisional layer may be formed as the provisional layer 2 in "Description of the prior Art". That is, after a resist is applied uniformly on a main surface of the substrate by spin-coating or the like, it is exposed and developed through a Cr-mask to form the provisional layer. Besides, it may be formed by that a film made of polysilicon, etc. is formed, by a CVD method or the like, uniformly on the main surface of the substrate, and thereafter a protect layer made of a resist is formed on the film and wet-etched.

The thickness of the thin film-processed body constituting the thin film-planar structure of the present invention is not restricted, and is determined depending on the use of the structure. In the use of various sensor or various probes, it is preferably 1–20 $\mu$m.

EXAMPLES

This invention is concretely described on the examples, with reference to the drawings.

Example 1

In this example, the thin film-planar structure was produced by directly removing a part of a substrate without forming a provisional layer.

FIGS. 7–11 are process charts showing a producing process of the thin film-planar structure of this example.

Figure 7:
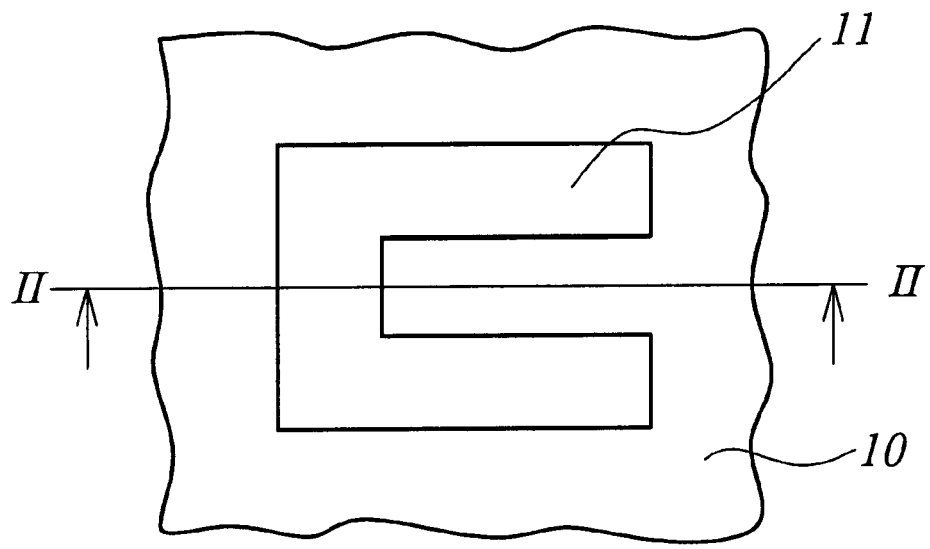
FIG. 7 is a plan view showing a first step in an embodiment of the method for producing the thin film-planar structure according to the present invention.
Figure 8:
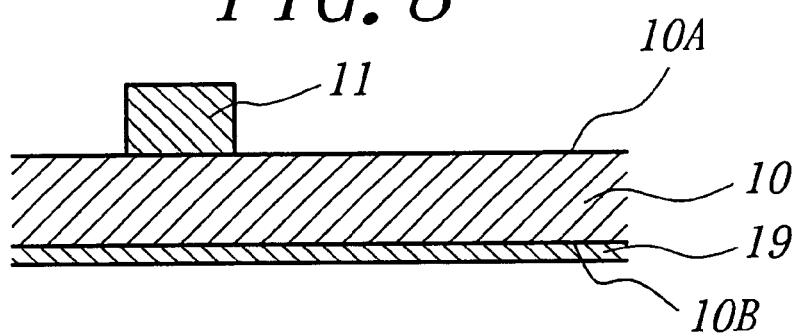
FIG. 8 is a cross sectional view taken on line II—II of the plan view in FIG. 7.
Figure 9:
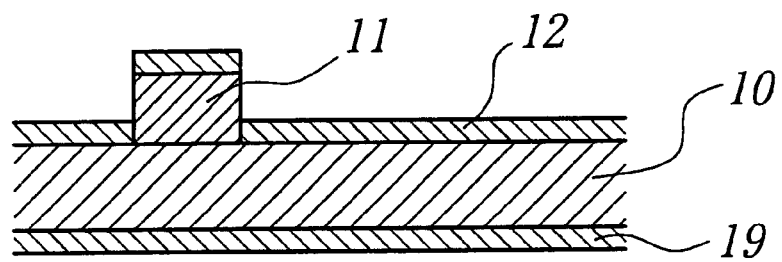
FIG. 9 is a cross sectional view showing a step after the step of FIGS. 7 and 8.
Figure 10:
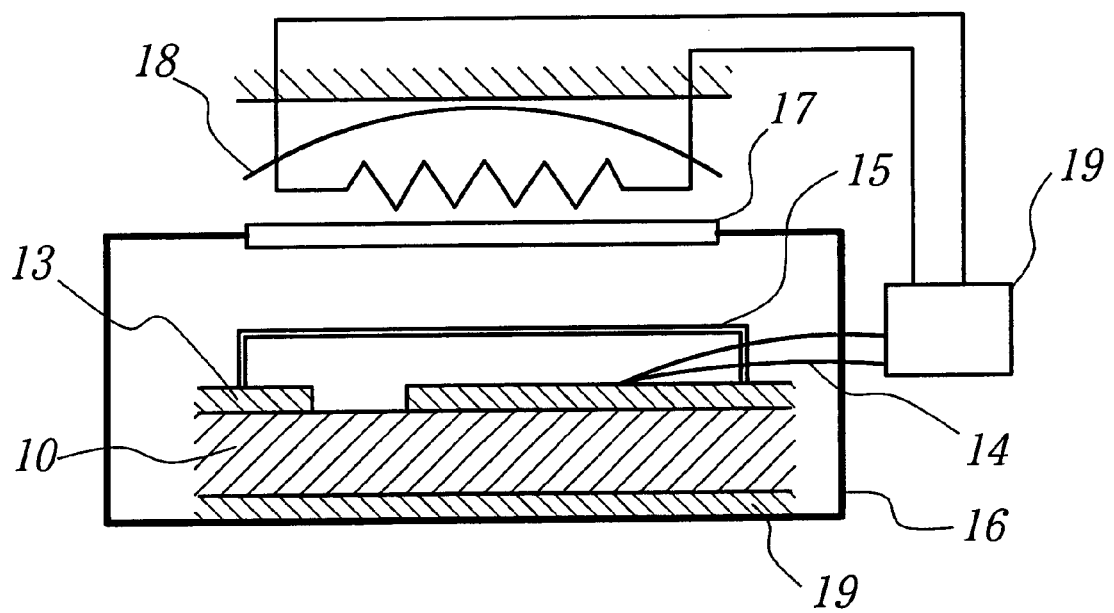
FIG. 10 is a cross sectional view showing a step after the steps of FIG. 9.
Figure 11:
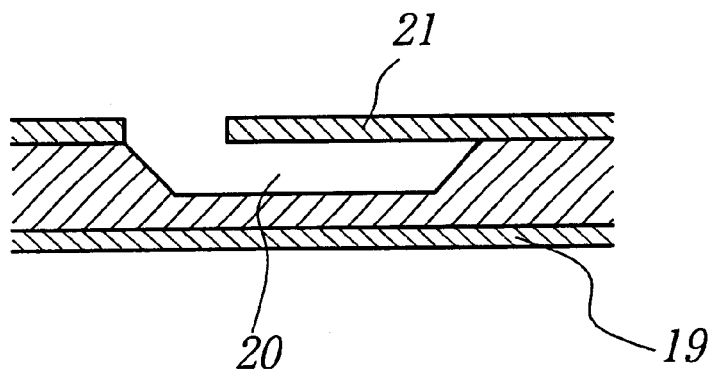
FIG. 11 is a cross sectional view showing a step after the steps of FIG. 10.

FIG. 7 is a plan view showing a first step in the producing method of the thin film planar structure of the present invention, and FIG. 8 is a cross sectional view taken on line II—II of the plan view in FIG. 7. FIGS. 9–11 are cross sectional views showing steps after the step of FIGS. 7 and 8 with time.

A substrate 10 was composed of a single crystalline silicon wafer having a thickness of 200 $\mu$m and a crystal orientation <100>.

First of all, as shown in FIGS. 7 and 8, a polyimide film was formed in a thickness of 5 $\mu$m, by a spin coat method, on a main surface 10A of the substrate 10. Then, the polyimide film was patterned by RIE (reactive ion etching) to form a patterned layer 11. A silicon oxide layer 19 was formed, by a thermal oxidizing method, on the backside surface 10B of the substrate 10.

Subsequently, as shown in FIG. 9, a thin film 12 made of a metallic glass having a $Zr_{66}Cu_{33}Al_1$ composition was formed in a thickness of 2 $\mu$m by a sputtering method on the main surface 10A of the substrate 10 so as to cover the patterned layer 11.

Herein, the metallic glass having the composition of $Zr_{66}Cu_{22}Al_1$ had a glass-transition temperature (Tg) of 360° C. and a crystallization-starting temperature (Tx) of 421° C.

Then, as shown in FIG. 10, the patterned layer 11 was removed by dipping the substrate 10 with the layer 11 into a solution of potassium hydroxide and the thin film 12 was patterned to form a one side-fixed beam like thin film-processing body 13.

Next, a thermocouple 14 and a cover 15 composed of Ti foil (a 50 $\mu$m thickness) were installed on and above the thin film-processed body 13, respectively. The thus obtained assembly was set into a vacuum chamber 16, the interior of which is evacuated to a pressure below $10^{-4}$ Pa by a vacuum pump (not shown).

The vacuum chamber 16 has a quartz glass window 17 and an infrared heater 18 above the window 17. The infrared heater 18 and the thermocouple 14 are connected to a thermocontroller 19, whereby the thin film-processed body 13 is heated to a temperature set by the infrared heater 18 with its temperature being directly monitored by the thermocouple 14. The cover 15 is made of Ti metal which is active at a higher temperature. Therefore, it absorbs the remaining oxygen during the heating and thereby can prevent the thin film-processed body from being oxidized. Moreover, it can even the heating irregularity of the infrared heater 18, which enables the thin film-processed body 13 to be heated uniformly.

Subsequently, the thin film-processed body 13 was heated to 387° C. at a heating rate of 10° C./min and was held for 30 minutes. Thereafter, it was cooled down to room temperature at a cooing rate of 10° C./min by controlling radiation cooling and the assembly having the thin film-processed body 13 was taken out of the vacuum chamber 16.

Then, as shown in FIG. 11, a part of the substrate 10 was etch-removed by dipping the assembly into a solution of potassium hydroxide at 80° C. for two hours, to form an etch pit 20. As a result, a thin film-planar structure 21 composed of the thin film-processed structure 13 was obtained.

Figure 12:
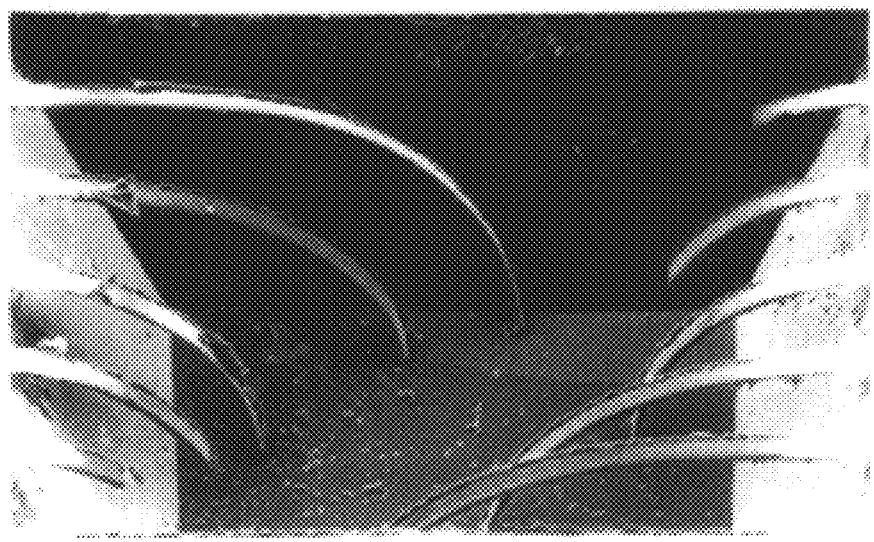
FIG. 12 is a scanning electron microscope's photograph of a thin film-planar structure produced by the method of the present invention.

FIG. 12 is a scanning electron microscope's photograph of the thin film-planer structure produced as above mentioned. On the other hand, FIG. 13 is a scanning electron microscope's photograph of the thin film-planar structure produced without heating in a supercooled liquid phase region.

Figure 13:
FIG. 13 is a scanning electron microscope's photograph of a thin film-planer structure produced by the conventional producing method.

As is apparent from FIGS. 12 and 13, the thin film-planar structure produced according to the present invention has the thin film-processed body, constituting the structure, maintaining its planer shape.

Example 2

In this embodiment, a provisional layer was formed on a substrate and was removed to form the thin film-planer structure.

FIGS. 14–18 are process charts showing a producing process of the thin film-planar structure of this example.

Figure 14:
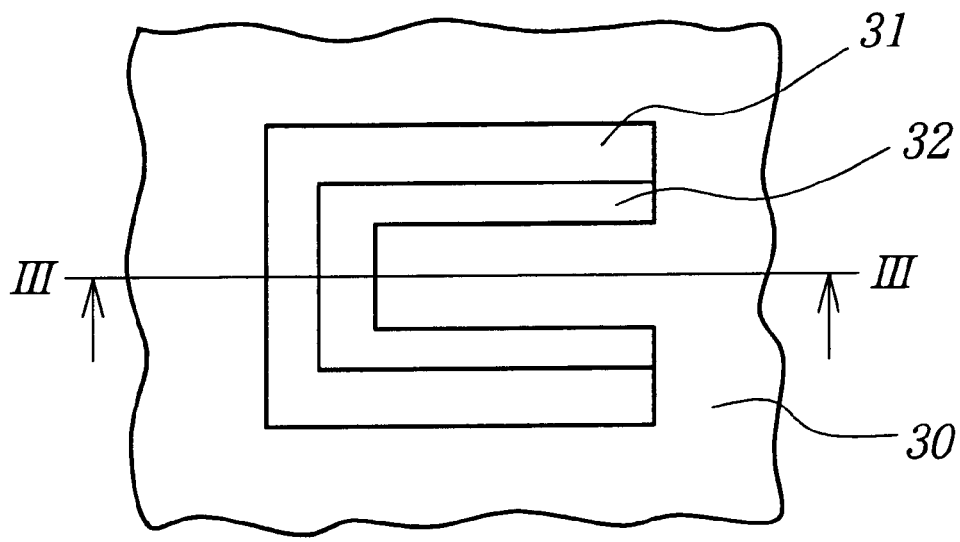
FIG. 14 is a plan view showing a first step in another embodiment of the method for producing the thin film-planar structure according to the present invention.
Figure 15:
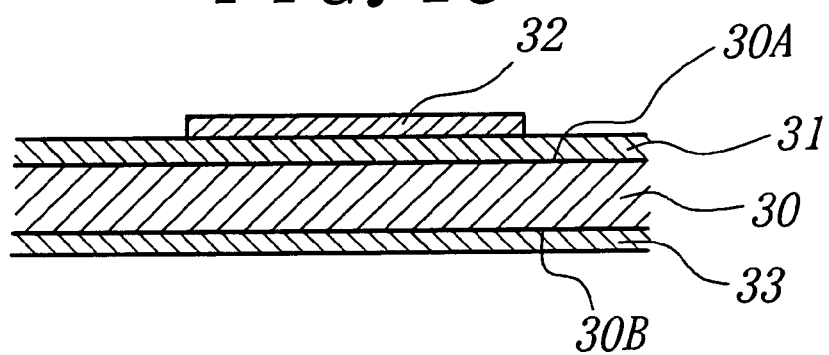
FIG. 15 is a cross sectional view taken on line III—III of the plan view in FIG. 14.
Figure 16:
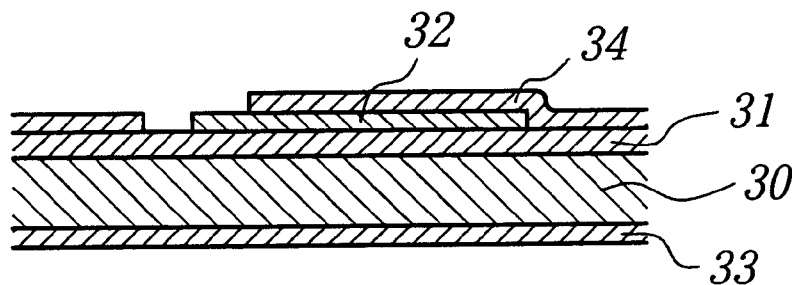
FIG. 16 is a cross sectional view showing a step after the step of FIGS. 14 and 15.
Figure 17:
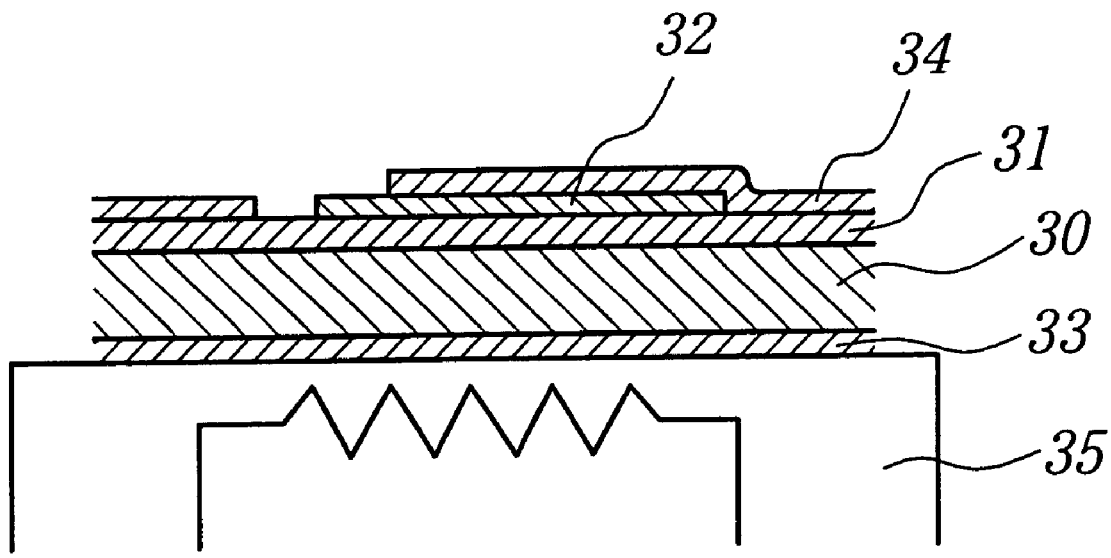
FIG. 17 is a cross sectional view showing a step after the step of FIG. 16.
Figure 18:
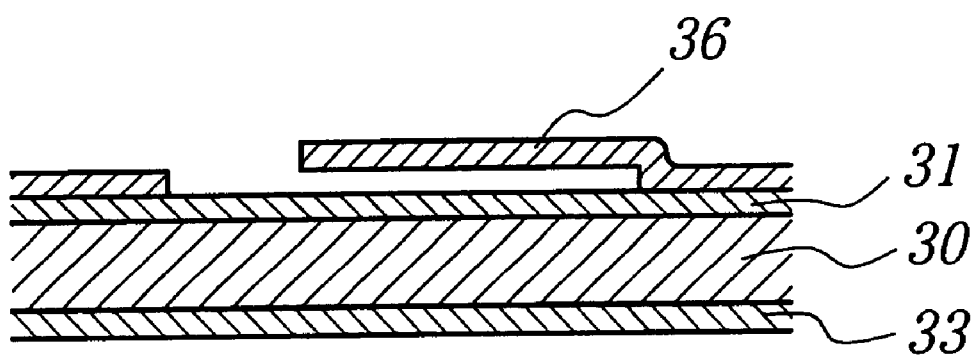
FIG. 18 is a cross sectional view showing a step after the step of FIG. 17.

FIG. 14 is a plan view showing a first step in the producing method of the thin film-planer structure of the present invention, and FIG. 15 is a cross sectional view taken on line III—III of the plan view in FIG. 14. FIGS. 16–18 are cross sectional views showing steps after the step of FIGS. 14 and 15 with time.

A substrate 30 was composed of a single crystalline silicon wafer having a thickness of 200 $\mu$m and a crystal orientation <100>. Then, on the substrate 30, a silicon oxide film 33 was formed in a thickness of 1 $\mu$m.

First of all, as shown in FIGS. 14 and 15, a protect layer 31 was formed, on a main surface 30A of the substrate 30, in a thickness of 0.1 μm. Then, a film made of polysilicon was formed in a thickness of 1 μm on the protect layer 31 by sputtering. A resist as a protect film was applied on the polysilicon film by spin coating. Subsequently, the substrate 30 was dipped into a solution of 40 wt %-potassium hydroxide and thereby a provisional layer 32 was formed by etching the polysilicon film.

Then, as shown in FIG. 16, a thin film made of boron oxide ($B_2O_3$) was formed, on the main surface 30A of the substrate, in a thickness of 2 μm by a CVD method so as to cover the provisional layer 32 thereon. A resist having a given shape was applied on the thin film by spin coating. The substrate 30 was dipped into a solution of hydrofluoric acid and thereby the thin film was etched to form a thin film-processed body 34.

Then, as shown in FIG. 17, the thus obtained assembly was set on a resistive heating equipment 35 and heated to 560° C. at a heating rate of 10° C./min. Herein, the above boron oxide had a glass-transition temperature (Tg) of 553° C. The assembly was held at that temperature for five minutes and thereafter, cooled down to room temperature at a cooling rate of 10° C./min by controlling radiation cooling.

Subsequently, as shown in FIG. 18, the assembly was dipped into a solution of 40 wt %-potassium hydroxide kept in 80° C. for 15 minutes and thereby the provisional layer 32 was etched and removed to form a thin film-planer structure.

Although the present invention was described in detail with reference to the above examples, this invention is not limited to the above disclosure and every kind of variation and modification may be made without departing from the scope of the present invention.

In the present invention, the thin film-planer structure is composed of a thin film made of an amorphous material having a supercooled liquid phase region. In producing the thin film-planar structure, the thin film constituting the structure is etch-processed to form a thin film-processed body, which is heated to a temperature within the supercooled liquid phase region.

Accordingly, the stress generated in the thin film-processed body is relaxed during the heating treatment, and thereby the thin film-processed body is not bended due to the stress after the thin film-planer structure is formed. Consequently, the thin film-planar structure can be provided in good reproducibility.

What is claimed is:

1. A method for producing a thin film-planar structure comprising the steps of forming on a substrate a thin film made of an amorphous material having a supercooled liquid phase region, processing the thin film into a given shape to form a thin film-processed body, heating and holding for a given period the thin film-processed body to a temperature within the supercooled liquid phase region, cooling down the thin film-processed body to a room temperature from the temperature within the supercooled liquid phase region, and removing at least a part of the substrate to produce the thin film-planar structure composed of the thin-film-processed body.

2. A method for producing a thin film-planar structure comprising the steps of:

forming on a substrate a patterned provisional layer, forming on the substrate a thin film made of an amorphous material having a supercooled liquid phase region so as to cover the provisional layer, processing the thin film into a given shape to form a thin film-processed body, heating and holding for a given period the thin film-processed body to a temperature within the supercooled liquid phase region, cooling down the thin film-processed body to a room temperature from the temperature within the supercooled liquid phase region, and removing the provisional layer to produce the thin film-planar structure composed of the thin film-processed body.

3. A method for producing a thin film-planar structure as defined in claim 1, wherein the amorphous material has a glass-transition temperature within 200–600° C. and a temperature width of not less than 20° C. in the supercooled liquid phase region.

4. A method for producing a thin film-planar structure as defined in claim 2, wherein the amorphous material has a glass-transition temperature within 200–600° C. and a temperature width of not less than 20° C. in the supercooled liquid phase region.

* * * * *